US007977698B2

(12) United States Patent
Ling et al.

(10) Patent No.: US 7,977,698 B2
(45) Date of Patent: Jul. 12, 2011

(54) SYSTEM AND METHOD FOR SURFACE MOUNTABLE DISPLAY

(75) Inventors: Elizabeth Fung Ching Ling, Penang (MY); Chia Chee Wai, Penang (MY); Ng Joh Joh, Penang (MY); Koay Hui Peng, Penang (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 1005 days.

(21) Appl. No.: 11/084,517

(22) Filed: Mar. 18, 2005

(65) Prior Publication Data

US 2006/0220051 A1 Oct. 5, 2006

(51) Int. Cl.
*H01L 33/00* (2010.01)
*H05K 3/30* (2006.01)
*H05K 3/34* (2006.01)

(52) U.S. Cl. .......... 257/99; 362/646; 362/800; 257/696; 257/718; 257/726; 257/727; 257/457; 257/79; 257/81; 257/100

(58) Field of Classification Search .................. 257/434, 257/99, 343, 692, 676, 293, 696, 718, 726, 257/727, 457, 79, 81, 100, 693–695, 666, 257/435; 362/240, 252, 237
See application file for complete search history.

(56) References Cited

U.S. PATENT DOCUMENTS 4,254,453 A * 3/1981 Mouyard et al. .............. 362/240
4,949,084 A * 8/1990 Schwartz et al. .............. 340/2.2
4,959,761 A * 9/1990 Critelli et al. ................. 362/646
5,226,723 A * 7/1993 Chen ............................ 362/241
5,311,407 A * 5/1994 Lumbard ....................... 361/813
5,390,093 A * 2/1995 Himeno et al. ............... 362/249
5,660,461 A * 8/1997 Ignatius et al. ............... 362/241
5,776,802 A * 7/1998 Ochi et al. .................... 438/123
6,007,357 A * 12/1999 Perino et al. .................. 439/327
6,106,137 A * 8/2000 Adams et al. ................. 362/237
6,257,736 B1 * 7/2001 Fehrenbach .................. 362/640
6,345,902 B2 * 2/2002 Ohkohdo et al. ............. 362/549
6,541,800 B2 * 4/2003 Barnett et al. .................. 257/98
6,789,921 B1 * 9/2004 Deloy et al. .................. 362/252
6,882,021 B2 * 4/2005 Boon et al. .................... 257/434
7,078,729 B2 * 7/2006 Suzuki et al. ................... 257/79
7,211,835 B2 * 5/2007 Ono ............................... 257/99
7,344,296 B2 * 3/2008 Matsui et al. ................. 362/652
7,467,888 B2 * 12/2008 Fiene ............................ 362/640
2004/0075100 A1 * 4/2004 Bogner et al. .................. 257/99
2005/0007783 A1 * 1/2005 Ono ............................. 362/294
2005/0180157 A1 * 8/2005 Watanabe et al. ............. 362/543

* cited by examiner

*Primary Examiner* — Zandra Smith
*Assistant Examiner* — Tsz K Chiu

(57) ABSTRACT

A system and method is disclosed for allowing a solid substrate, such as a printed circuit board (PCB), to act as the support structure for an electronic circuit. In one embodiment, the LEDs which form a part of a scrambler assembly are constructed on a first substrate and the electrical connections are run to the edges of the substrate and end in electrical contacts positioned thereat. The substrate is then connected to the scrambler package by a series of electrical and mechanical connections to form the LED package. The electrical contacts which are part of the LED package extend from the LED package so as to enable electrical contact with a separate controller substrate.

21 Claims, 3 Drawing Sheets

10
12
23-N
23-2
23-1
23-3
110
31
16
31
110
13
100-N
100-2
100-1
12-1
100-3
101-NR
101-3R
101-1R
101-2R 12-1
50
12
24
100-1
23-1
10
110
110
21
13
51
22-2
22-1
51

12-1
60
12
24
100-1
23-1
10
110
110
62
13
61
22-2
22-1
61

76
70
77
700
73
71
72-2
72-1
74
75

86
80
77
800
73
71
81
84
82
83

SYSTEM AND METHOD FOR SURFACE MOUNTABLE DISPLAY

BACKGROUND OF THE INVENTION

It has become common practice to use light emitting diode (LED) displays for a variety of purposes. Typically such displays are manufactured as seven-segment displays or alphanumeric displays, and, if desired, can be arranged as dot matrix displays. Such displays require multi-color and high brightness and must have a thin profile.

In a typical manufacturing process custom display devices use the concept of stretching the light from an LED by diffusion and reflection. The LED chips are mechanically attached onto a printed circuit board (PCB) or lead-frame by using electrically conductive adhesive, e.g. silver epoxy. Gold (or other conductive material, such as aluminum) is used to wire bond the top of the LED die to the PCB. A cone shaped reflecting cavity is cast inside a rectangular package around each LED. A plastic housing, often referred as 'scrambler', forms the display package and contains the LED segment cavities. The housing also provides structural integrity to the LED package. Generally, the material used for the scrambler is polycarbonate with $TiO_2$ sealant to prevent light leakage. Optical grade epoxy fills the top of the cavity and also fills the bottom of the scrambler to form the stretched segment.

Presently, these custom LED display packages are predominately through-hole mounted because of economy of manufacture. However, surface mounting assemblies are quickly replacing wave-soldering techniques because wave soldering has reached the limit of its capabilities. Currently, reflow soldering has become the leading technique for soldering components, such as LED packages to PCBs. Miniaturization of control panels and simplified manufacturing processes are requiring LED manufacturers to convert through-hole devices to surface-mountable devices.

One manufacturing process now being used for surface mounting LED packages to PCBs is a lead-frame process where a metal frame is folded around a substrate holding the LED. Such processes are time-consuming and cumbersome. An alternate process for surface mounting is to mount the LED onto a PCB for support purposes and to then surface mount the PCB onto a controller PCB board. Because of surface irregularities between the two PCBs, such PCB/PCB mounting is difficult to achieve in a reliable manner.

In general, the PCB to PCB or even lead-frame to PCB mating tends to face surface irregularities as a result of PCB warping or lead-frame lead coplanarity issues. In addition, as the customized displays become larger and have more LED segments, the warping becomes more pronounced and adds further complexity to the soldering process.

BRIEF SUMMARY OF THE INVENTION

A system and method is disclosed for allowing a solid substrate, such as a printed circuit board (PCB), to act as the support structure for an electronic circuit. In one embodiment, the LEDs which form a part of a scrambler assembly are constructed on a first substrate and the electrical connections are run to the edges of the substrate and end in electrical contacts positioned thereat. The substrate is then connected to the scrambler package by a series of electrical and mechanical connections to form the LED package. The electrical contacts which are part of the LED package extend from the LED package so as to enable electrical contact with a separate controller substrate.

The spring-loaded electrical contacts allow for flexible mating between the LED package and the electronic circuit thereby allowing the LED package to become surface mounted to the separate controller substrate. In one embodiment, both substrates are PCBs.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 7:
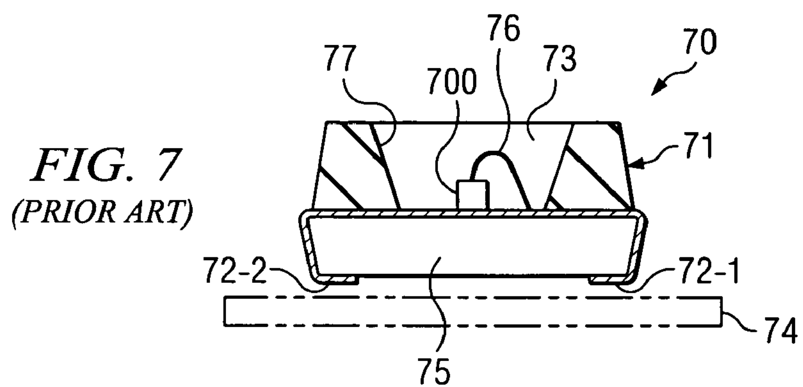
FIGS. 7 and 8 show prior art LED devices.

Surface mountable (SMT) devices are used when reflow soldering is employed. Since manufacturing techniques now favor reflow soldering, it is important for devices to have surface mounting capability. FIG. 7 shows prior art LED display 70 adapted for surface mounting on a PCB, such as PCB 74, using electrical contacts 72-1, 72-2 which are part of lead-frame 72 to make electrical contact with PCB 74. Lead-frame 72 is folded around scrambler portion 75 of the LED package. The lead-frame serves to hold the LED, such as LED 700, in position within scrambler portion 73. Wire bond 76 connects LED 700 to the lead-frame. When such a lead-frame is used, the manufacturing processes are tedious and result in limited package design capability. Lead-frame based custom LED packages are thus relatively expensive and are not viable for small-scale and medium-scale production. In addition, lead-frame based custom LED modules do not allow for cross-linking circuitry as the stamping tools are not able to stack layers of conductive traces in the lead-frame to create the tightly bound network that is necessary in multi-layer printed circuit boards. Such a handicap limits lead-frame based custom LED modules to only single or dual digit display. Further, it is difficult to integrate ICs or other electrical components into the display to make an intelligent package.

Figure 8:
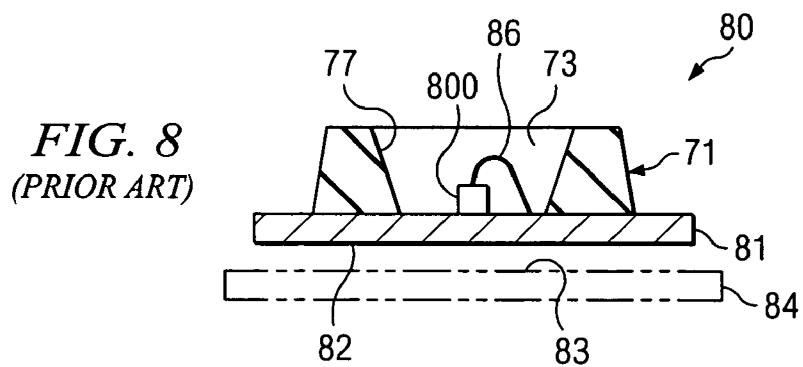

FIG. 8 shows a prior art LED display using a PCB, such as PCB 81, as a substrate for the LED. The manufacturing process requires securing the plastic casing, such as casing 71, onto PCB 81 either by using adhesive, epoxy filling or heat staking. LED 800 is constructed on PCB 81 and wire bond 86 connects the top of LED 800 to the PCB. It is critical to ensure that bottom plane 82 of PCB 81 is precisely planar to top surface 83 of controller substrate 84, otherwise there could be soldering problems, such as poor wetting, opens, solder bridging, solder joint deformation, etc., between electrical contacts (not shown) on bottom surface 82 of PCB 81 and solder pads (not shown) on top surface 83 of PCB 84.

Heat staking casing 71 to PCB 81 leaves a lump of melted thermoplastic with a shape that is not easily controlled. Thus, an additional process must be carried out to file and clean residue from the heat-staking process. Relying on heat staking alone presents a danger as heat staking has a tendency to produce cross-talk if there's a gap between the PCB and reflector 71. Such a gap allows light to leak between luminous segments. When the lump of thermoplastic is removed, the holding strength between the casing plastic and the PCB is weakened.

Figure 1:
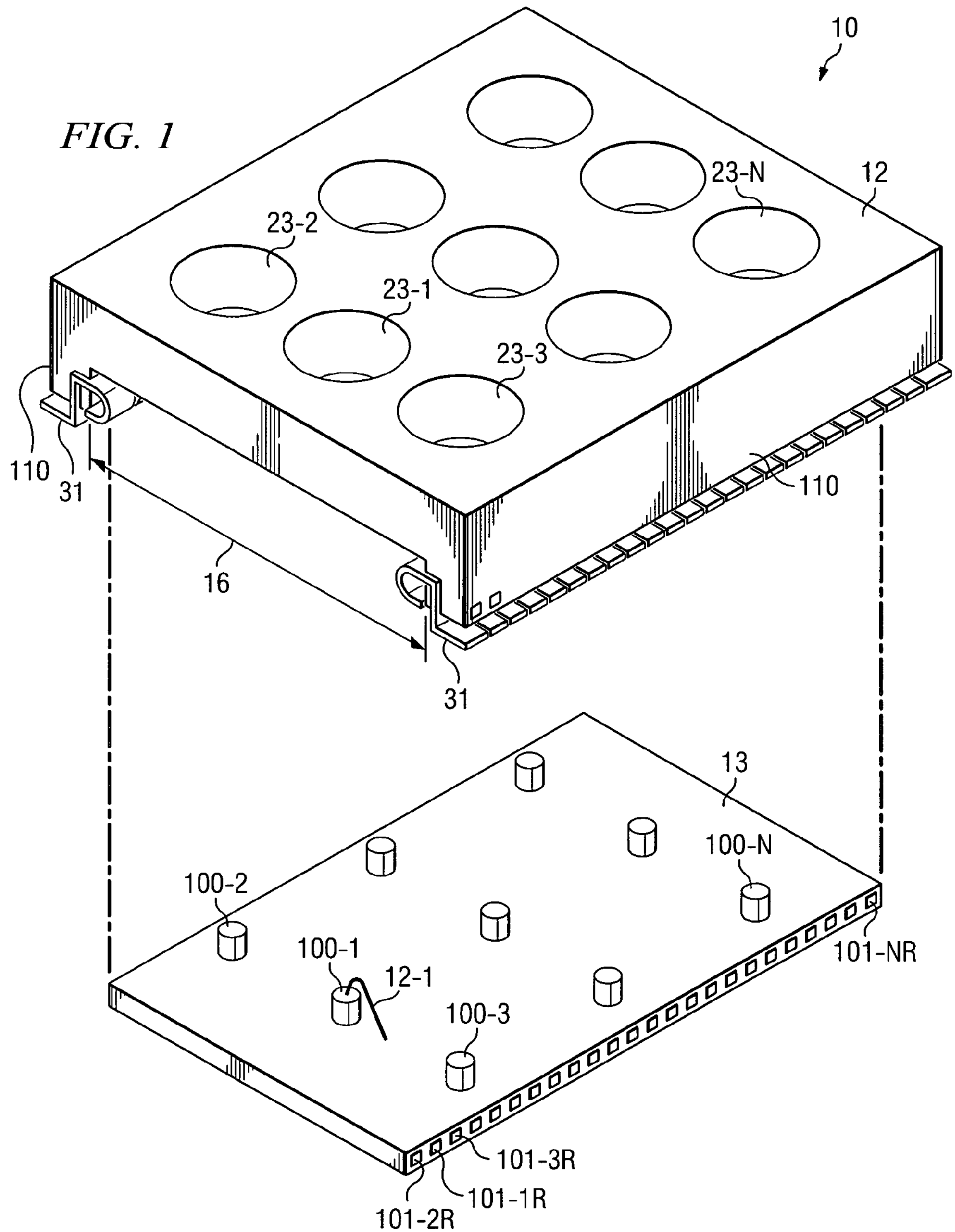
FIG. 1 is a plan view of one embodiment of a multi-LED display device.
Figure 2:
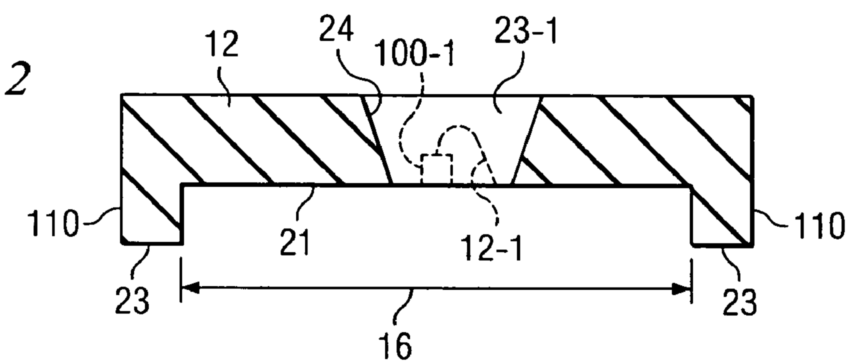
FIG. 2 is a side view of the device shown in FIG. 1 without the electrical contacts and without the LED substrate.

FIG. 1 shows one embodiment 10 of an LED display having multiple LEDs (such as LEDs 100-1 to 100-N) constructed on substrate 13. Substrate 13 is mated into area 16 of top structure 12 to form LED package 10. A plurality of electronic devices, such as LEDs 100, can be constructed on substrate 13 and electrically connected, for example by bond wire 12-1, to the substrate. Constructed on the sides (or on the top or bottom surface) of substrate 13 are a plurality of electrical contact pads 101 adapted to mate with contacts, such as contacts 31 (to be discussed with respect to FIGS. 5 and 6), which are positioned on the inside of edges 110 of structures 12. These contact pads are for the purpose of communicating electrical signal power from a controller PCB (shown in FIG. 4) to control the respective LEDs contained thereon. Openings 23-1, 23-N fit around LEDs 100-1, 100-N, respectively, and are constructed as shown in FIG. 2. These need not be actually "opened" to the surface so long as light from each LED is visible outside LED package 10.

FIG. 2 shows a side view of device 10 (shown in FIG. 1). Shown in phantom is LED 100-1 with wire bong 12-1. LED 100-1 is mounted on a substrate which mates within area 16, such that when the substrate is mated the LED becomes positioned within reflector area 23-1 defined by barriers 24.

Area 16 of scrambler 10 is defined by edges 110 of scrambler top structure 12 which edges protrude below bottom surface 21. As discussed, substrate 13 mates to top structure 12 within the peripheral confines of edges 110 of scrambler 12.

Figure 3:
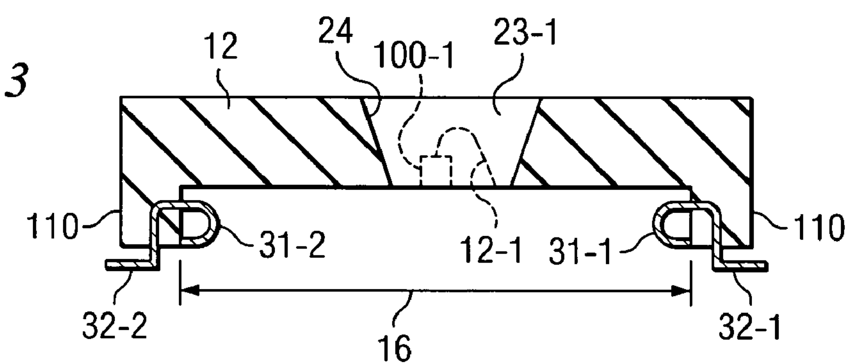
FIG. 3 is a side view of the device of FIG. 1 shown with electrical contacts and without an LED substrate.

FIG. 3 is a side view of device 10 (without substrate 13) showing one embodiment of contacts 31-1 and 31-2 which are "spring-loaded" and insert-molded into peripheral edges 110 of top structure 12. Each contact has a bottom surface 32-1, 32-2 which, as will be seen in FIG. 4, mate with contacts on the top surface of a controller substrate. Different electronically conductive materials, for example, beryllium copper, copper alloy, etc., can be used to create the desired contact areas. In some situations, the contacts can be spring-loaded and such spring-loaded contacts may also act as mechanical locks to maintain substrate 13 in mechanical contact with top structure 12. The height and shape of the contacts can be tailored to meet individual device requirements and need not be the same dimension or construction for all contacts on a device.

Figure 4:
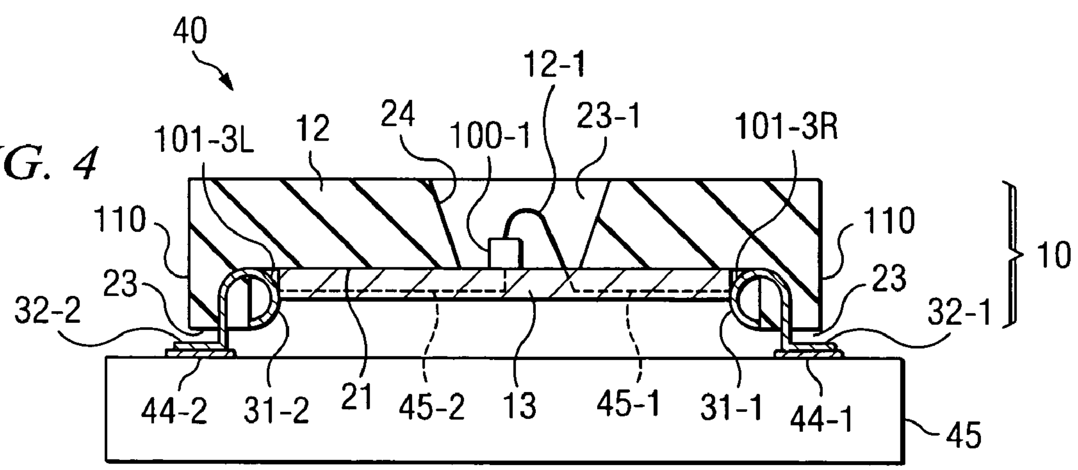
FIG. 4 is a side view of the device of FIG. 1 shown mated to a controller PCB.

FIG. 4 shows one embodiment of the side view of device 40 comprising device 10 positioned for mating with a controller substrate, such as PCB 45. Device 10 has scrambler structure 12 mated with PCB 13 with electrical contact between scrambler structure 12 and PCB 13 being accomplished by spring-loaded contacts 31-1, 31-2. PCB 13 is mated with scrambler top structure 12 by snapping onto spring-loaded contacts 31-1, 31-2. Electrical connection is established when the contacts and the corresponding metal pads (101 in FIG. 1) on PCB 13 are in contact. The pads on the PCB can be easily formed by using any well-known metallization process. When substrate 13 is mated with structure 12, LED 100-1 is positioned within reflector section 23-1 of top structure 12 of LED display 10. Electrical control of the LED is by voltage being applied to areas 32-1 and 32-2 of contacts 31-1 and 31-2, respectively. Current then flows via wires (or current paths 45-1, 45-2) to the respective LEDs. Areas 32-1 and 32-2, as well as areas of other contacts (not shown), are designed to mate with electrical contacts, such as contacts 44-1, 44-2, of substrate 45. Substrate 45 can be, for example, a controller PCB having constructed thereon other electronic circuitry for controlling LED display 10.

Contacts 44-1, 44-2, in one embodiment, are designed for surface soldering onto PCB 45. Using this arrangement, PCB 13 is free to flex so long as it makes electrical contact with spring-loaded contacts 31-1, 31-2 which, in turn, makes contact with the top surface of PCB 45. Note that while the contacts are shown as being individual, they can each carry multiple signals and they need not be spaced on different sides of the device provided only that individual control of each LED (or other electrical device) can be achieved. Also note that bottom surface 21 of substrate 13 can be above bottom surfaces 23 of the peripheral edges of device 10 which define area 16 for receiving substrate 13. While the edges defining receiving area 16 (FIG. 1) have been shown to be on only two sides of substrate 13, such edges can surround the substrate, if desired. One edge of substrate 13 may be directly abutting edge 110, the scrambler top structure and the spring-loaded contacts could apply force from an opposite edge, if desired. In such a configuration, all of the electrical contacts would be on the same side of substrate 13.

Figure 5:
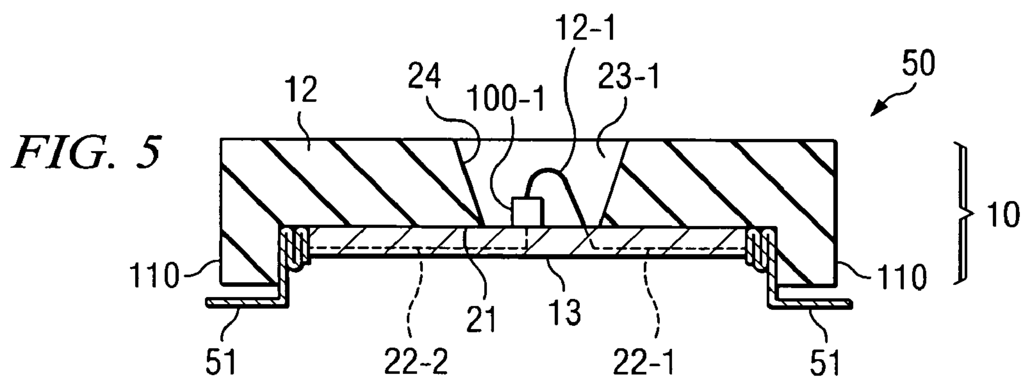
FIGS. 5 and 6 are alternative embodiments of the device of FIG. 4 shown prior to mating with a controller PCB.

There is no limit on the dimensions of the spring-loaded contacts. Practically, electrically conductive contacts with larger surface area will enhance the contact force to ensure good electrical connection between PCB 13 and structure 12. It should be noted that there is also no limit on the number of contacts that can be insert-molded on structure 12. Also, the spring-loaded contacts can be any shape desired. Along that line, FIG. 5 shows device 50 having "folded" contacts 51 yielding longer spring distances. As discussed above, any electrically conducting materials or metals can be used as the contacts to be insert-molded into the scrambler. By the same token, metal printing along the edges of 110 (along the receiving area) can also be used in place of (or in addition to) the insert-molded contacts.

Figure 6:
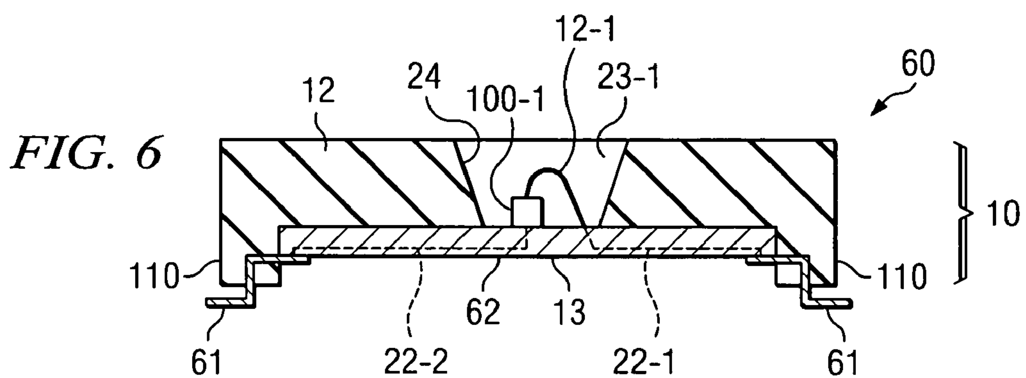

FIG. 6 shows one embodiment of a "stepped" contact, such as contact 61. which can be used to contact the bottom surface 62 of PCB 13. Different electrically conducting materials, for example, beryllium copper, copper alloy, etc., can be used to create the spring-loaded contacts. Also, as discussed above, such electrically conductive material can be printed or plated on to the sides of the respective devices.

Using the concepts discussed herein only a small process deviation adapted to an existing manufacturing process produces devices which can easily be surface soldered together.

The height and shape of the contacts can be tailored to meet individual device requirements and need not be the same dimension or construction for all contacts on a device.

The construction discussed herein is applicable for different device types, for example, for air-gap devices or silicon protection SMT devices. Using the concepts taught herein, either the top scrambler structure or the PCB can be easily replaced leading to higher yields.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electronic device comprising:

an electronic component housing;

at least one electronic component positionable within the electronic component housing;

the electronic component housing defining an area for receiving a substrate;

at least one set of electrical contacts positioned within the substrate receiving area, and contained by the electronic component housing, the at least one set of electrical contacts adapted for spring-load mating with a substrate positioned within the substrate receiving area, and;

a substrate for positioning within the substrate receiving area, the substrate comprising:

at least one electronic component mounted on the substrate, the at least one electronic component positioned such that when the substrate is within the substrate receiving area, the at least one electronic component is within the electronic component housing; and means for electrically connecting the at least one electronic component with at least one set of electrical contacts when the substrate is positioned within the substrate receiving area.

2. The electronic device of claim 1, wherein the at least one electronic component is a LED and the electronic component housing is a scrambler.

3. The electronic device of claim 1, wherein the at least one set of electrical contacts spring-load mate with a side surface of the substrate.

4. The electronic device of claim 1, wherein the at least one set of electrical contacts mate with a bottom surface of the substrate.

5. The electronic device of claim 1, wherein the at least one set of electrical contacts are further adapted to maintain a positioned substrate in mating relationship with the electronic component housing.

6. The electronic device of claim 1, wherein the at least one set of electrical contacts further comprise: a surface area for mating with a substrate not positioned within the substrate receiving area.

7. The device of claim 1 wherein the at least one electronic component is positioned in a reflector area that is sealed.

8. The device of claim 1, wherein the at least one set of spring loaded electrical contacts configured to mechanically lock the substrate into place within the substrate receiving area.

9. A display device comprising:

a scrambler having a plurality of reflector partitions therein;

at least one LED positionable within certain of the plurality of reflector partitions;

a plurality of spring loaded electrical contacts positioned at peripheral locations around a bottom surface of the scrambler, the plurality of spring loaded electrical contacts in electrical communication with substrates in mating relationship within the peripheral locations; and, a first substrate mated with the scrambler such that the plurality of spring loaded electrical contacts make electrical contact with electrical contacts on the first substrate, the first substrate comprising;

(a) at least one LED mounted thereon, the at least one LED positioned within one of the plurality of reflector partitions when the first substrate is in spring-loaded contact with the scrambler; and (b) electrical connections between the at least one LED and the electrical contacts on the substrate.

10. The display device of claim 9 further comprising:

a second substrate mated with the scrambler such that a least a portion of each of the plurality of spring-loaded electrical contacts makes electrical contact with the second substrate.

11. The display device of claim 10 wherein the second substrate comprises a controller for controlling the at least one LED.

12. A substrate for supporting LEDs thereon, the substrate comprising:

a plurality of spaced apart LEDs, each of the plurality of spaced apart LEDs having electrical leads extending therefrom, and each of the plurality of spaced apart LEDs configured to be inserted into a partitioned reflector area of a light scrambler; and a plurality of electrical contacts positioned at the periphery of the substrate, each of the plurality of electrical contacts configured to be in spring-loaded contact with the light scrambler.

13. The substrate of claim 12 wherein the spring-loaded contact comprises an electrical contact, a portion of which is configured for surface soldering onto a controller substrate.

14. The substrate of claim 13 wherein the plurality of electrical contacts are pads for mating with spring-loaded electrical contacts in the scrambler.

15. The LED substrate of claim 12, wherein the plurality of electrical contacts are located on the sides of the substrate.

16. The LED substrate of claim 12, wherein the plurality of electrical contacts are located on the top of the substrate.

17. The LED substrate of claim 12, wherein the plurality of electrical contacts are located on the bottom of the substrate.

18. The substrate of claim 12, wherein the plurality of electrical contacts are on one side only of the substrate.

19. An LED display comprising:

a substrate configured for supporting a plurality of LEDs;

a scrambler with a partitioned reflector separate from the substrate and configured for physically distributing light from the plurality of LEDs supported on the substrate;

spring loaded electrical contacts configured for flexibly locking the substrate to the scramble; and means, including the spring loaded electrical contacts for transferring electrical control signals to the LEDs from a separate control board via a surface solder connection on the separate control board.

20. The LED display of claim 19, wherein the spring loaded electrical contacts are physically mounted on the scrambler.

21. The LED display of claim 19, wherein the spring loaded electrical contacts are physically mounted on the substrate.

* * * * *